United States Patent
Ho et al.

(10) Patent No.: US 10,186,779 B2
(45) Date of Patent: Jan. 22, 2019

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Cheng-Yu Ho, Kaohsiung (TW); Chen-Chao Wang, Kaohsiung (TW); Chun-Yen Ting, Kaohsiung (TW); Ming-Fong Jhong, Kaohsiung (TW); Po-Chih Pan, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 246 days.

(21) Appl. No.: 15/348,854

(22) Filed: Nov. 10, 2016

(65) Prior Publication Data
US 2018/0131094 A1    May 10, 2018

(51) Int. Cl.
| | |
|---|---|
| H01L 23/34 | (2006.01) |
| H01Q 9/04 | (2006.01) |
| H01L 23/538 | (2006.01) |
| H01L 23/552 | (2006.01) |
| H01L 23/66 | (2006.01) |

(Continued)

(52) U.S. Cl.
CPC ......... *H01Q 9/045* (2013.01); *H01L 23/5383* (2013.01); *H01L 23/5384* (2013.01); *H01L 23/5386* (2013.01); *H01L 23/5389* (2013.01); *H01L 23/552* (2013.01); *H01L 23/66* (2013.01); *H01L 25/0657* (2013.01); *H01Q 9/0457* (2013.01); *H01Q 13/10* (2013.01); *H01Q 19/30* (2013.01); *H01Q 21/28* (2013.01); *H01L 24/17* (2013.01); *H01L 2223/6677* (2013.01); *H01L 2224/13147* (2013.01); *H01L 2224/16225* (2013.01); *H01L 2225/0652* (2013.01); *H01L 2225/06517* (2013.01); *H01L 2225/06572* (2013.01); *H01L 2924/01028* (2013.01); *H01L 2924/01078* (2013.01);

(Continued)

(58) Field of Classification Search
CPC . H01L 2223/6605; H01L 23/48; H01L 23/66; H01L 2223/6677; H01L 23/49838; H01L 23/535
USPC ............. 257/686, 723, 724, 728, 777
See application file for complete search history.

(56) References Cited

U.S. PATENT DOCUMENTS

| | | |
|---|---|---|
| 6,818,985 B1 | 11/2004 | Coccioli et al. |
| 7,649,499 B2 | 1/2010 | Watanabe |

(Continued)

*Primary Examiner* — S. V. Clark
(74) *Attorney, Agent, or Firm* — Foley & Lardner LLP; Cliff Z. Liu

(57) ABSTRACT

Various embodiments of the present disclosure relate to a semiconductor device package including a carrier, an electrical component, an antenna, a conductive pad and a conductive line. The carrier includes a top surface. The electrical component is disposed over the top surface of the carrier. The antenna is disposed over the top surface of the carrier and spaced away from the electrical component. The conductive pad is disposed over the top surface of the carrier and beneath the antenna, wherein the conductive pad includes a resonant structure. The conductive line is electrically connected to the electrical component and extends within the carrier. A part of the conductive line is beneath the antenna and the resonant structure of the conductive pad.

20 Claims, 6 Drawing Sheets

(51) Int. Cl.
  *H01L 25/065* (2006.01)
  *H01Q 13/10* (2006.01)
  *H01Q 19/30* (2006.01)
  *H01Q 21/28* (2006.01)
  *H01L 23/00* (2006.01)

(52) U.S. Cl.
  CPC .............. *H01L 2924/01079* (2013.01); *H01L 2924/1421* (2013.01); *H01L 2924/3025* (2013.01)

(56) References Cited

U.S. PATENT DOCUMENTS

| | | | |
|---|---|---|---|
| 8,624,381 B2 * | 1/2014 | Lachner | H01Q 1/2283 257/684 |
| 8,718,550 B2 | 5/2014 | Zhao et al. | |
| 2001/0052645 A1 | 12/2001 | Op't Eynde et al. | |
| 2007/0275506 A1 * | 11/2007 | Yamazaki | H01L 21/6835 438/118 |
| 2014/0110841 A1 * | 4/2014 | Beer | H01L 23/49822 257/738 |
| 2014/0117515 A1 * | 5/2014 | Lachner | H01L 23/3135 257/664 |

* cited by examiner

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly, to a semiconductor device package with an antenna and a shielding cover and a method of manufacturing the same.

2. Description of the Related Art

Wireless communication devices, such as cell phones, typically include antennas for transmitting and receiving radio frequency (RF) signals. Conventionally, a wireless communication device includes an antenna and a communication module, each disposed on different parts of a circuit board. Under the conventional approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. In addition, an RF signal transmission path between the antenna and the communication module may be long, thereby reducing quality of a signal transmitted between the antenna and the communication module.

SUMMARY

In accordance with some embodiments of the present disclosure, a semiconductor device package includes a carrier, an electrical component, an antenna, a conductive pad and a conductive line. The carrier includes a top surface. The electrical component is disposed over the top surface of the carrier. The antenna is disposed over the top surface of the carrier and spaced from the electrical component. The conductive pad is disposed over the top surface of the carrier and beneath the antenna, wherein the conductive pad includes a resonant structure. The conductive line is electrically connected to the electrical component and extends within the carrier. A part of the conductive line is located beneath the antenna and the resonant structure of the conductive pad.

In accordance with some embodiments of the present disclosure, a semiconductor device package includes a carrier, an electrical component, a conductive pad, an antenna and a conductive line. The carrier includes a top surface and a conductive line. The electrical component is disposed over the top surface of the carrier. The conductive pad is formed over the top surface of the carrier and beneath the antenna, wherein the conductive pad includes a resonant structure. The antenna is disposed over the top surface of the carrier and spaced from the active device. The conductive line is electrically connected to the electrical component and electromagnetically coupled to the antenna through the resonant structure of the conductive pad.

Figure 1A:
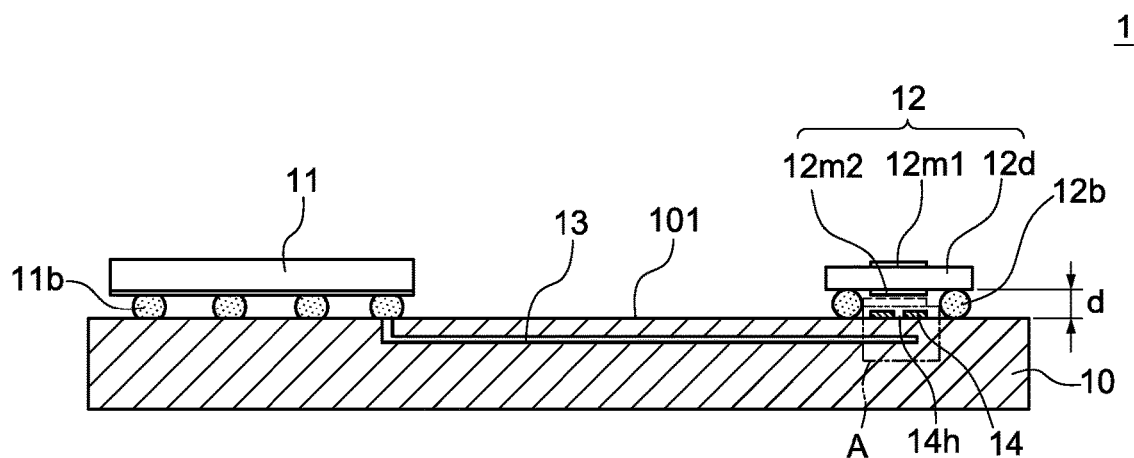
FIG. 1A illustrates a cross-sectional view of a semiconductor device package in accordance with some embodiments of the present disclosure.

Common reference numerals are used throughout the drawings and the detailed description to indicate same or similar components. The present disclosure will be more apparent from the following detailed description taken in conjunction with the accompanying drawings.

DETAILED DESCRIPTION

FIG. 1A illustrates a cross-sectional view of a semiconductor device package 1 in accordance with some embodiments of the present disclosure. The semiconductor device package 1 includes a carrier 10, an electrical component 11, an antenna 12, a conductive line 13 and a conductive pad 14.

The carrier 10 includes a top surface 101. The carrier 10 may be, for example, a printed circuit board, such as a paper-based copper foil laminate, a composite copper foil laminate, or a polymer-impregnated glass-fiber-based copper foil laminate. The carrier 10 may include an interconnection structure, such as a redistribution layer (RDL), for electrical connection between the electrical component 11 and other electrical components mounted on the carrier 10. In some embodiments, a relative permittivity (e.g., dielectric constant) of the carrier 10 is in a range from about 2 to about 4.

The electrical component 11 is on the top surface 101 of the carrier 10. The electrical component 11 may include an active electrical component and/or a passive electrical component. The electrical component 11 may be flip chip-bonded to the top surface 101 of the carrier 10 via one or more electrical connections 11b. The electrical connections 11b may be, for example, solder balls or copper (Cu) pillars. In some embodiments, a diameter or a height of each electrical connection 11b is in a range from about 250 micrometers (μm) to about 400 μm. In some embodiments, the electrical component 11 may be wire-bonded to the top surface 101 of the carrier 10 via one or more bonding wires. The electrical component 11 may be, for example, an integrated circuit (IC) chip or a die. In some embodiments, the electrical component 11 may include one or more passive elements, such as, for example, capacitors, resistors, inductors, or a combination thereof.

In some embodiments, the antenna 12 is on the top surface 101 of the carrier 10. The antenna 12 is spaced from the electrical component 11. The antenna 12 includes a first conductive layer 12m1, a second conductive layer 12m2 and a dielectric layer 12d. The first conductive layer 12m1 is attached (or coupled) to a top surface of the dielectric layer 12d. The second conductive layer 12m2 is attached to a bottom surface of the dielectric layer 12d. In some embodiments, a thickness of the dielectric layer is about 80 μm. In some embodiments, the first conductive layer 12m1 and the second conductive layer 12m2 include Nickel (Ni), Platinum (Pt), Gold (Au) or a combination thereof. The antenna 12 may be, for example, a patch antenna. In some embodiments, the antenna 12 is flip chip-bonded to the top surface 101 of the carrier 10 via one or more electrical connections 12b so that a distance d is formed between the bottom surface of the dielectric layer 12d and the top surface 101 of the carrier 10 for microwave or radio wave radiation. The electrical connections 12b may be, for example, solder balls or Cu pillars. In some embodiments, a diameter or a height d of each electrical connection 12b is in a range from about 250 μm to about 400 μm.

In some embodiments, the antenna 12 is configured to transmit or to receive electromagnetic waves with a frequency in a range from about 56 Gigahertz (GHz) to about 64 GHz. In some embodiments, the antenna 12 includes a bandwidth greater than about 7 GHz and a gain greater than about 10 decibels (dB).

In some embodiments, the conductive pad 14 is on the top surface 101 of the carrier 10 and beneath the antenna 12. For example, the conductive pad 14 is located between the carrier 10 and the antenna 12. The conductive pad 14 includes an aperture 14h. The conductive pad 14 includes a resonant structure. In some embodiments, the conductive pad 14 is spaced from the antenna at a distance from about 250 μm to about 400 μm.

In some embodiments, the conductive line 13 is disposed within the carrier 10. In some embodiments, a part or first portion of the conductive line 13 is located or disposed on the top surface 101 of the carrier 10. The conductive line 13 may be electrically connected to the electrical component 11 through one or more of the electrical connections 11b. A part or second portion of the conductive line 13 extends beneath the conductive pad 14 and the antenna 12. For example, the top surface 101 of the carrier 10 and the conductive line 13 are separated by a distance. The conductive line 13 may be electromagnetically coupled to the antenna 12 through the resonant structure of the conductive pad 14. In some embodiments, the conductive line 13 is a feed line to electromagnetically couple or receive a signal received by the antenna 12 and transmit the coupled or received signal to the electrical component 11. Alternatively, the conductive line 13 may be a feed line to electromagnetically couple or receive a signal from the electrical component 11 and transmit the signal to the antenna 12, and then the signal may be transmitted by the antenna 12.

Figure 1B:
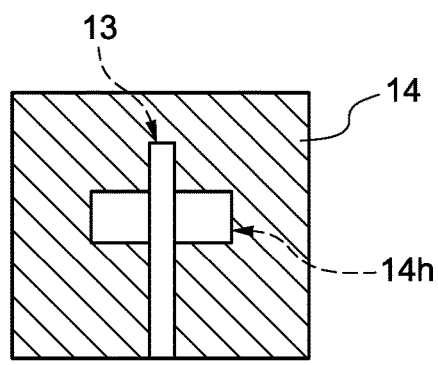
FIG. 1B illustrates a top view of a portion of the semiconductor device package shown in FIG. 1A in accordance with some embodiments of the present disclosure.

FIG. 1B illustrates a top view of a part of the semiconductor device package 1, the part being marked as "A" in FIG. 1A, according to some embodiments.

As shown in FIG. 1B, the conductive pad 14 includes the aperture 14h. A part of the conductive line 13 extends beneath the aperture 14h of the conductive pad 14. In other words, the aperture 14h may be disposed over a portion of the conductive line 13. In some embodiments, a direction of extension of the part of the conductive line 13 disposed under the aperture 14h is substantially perpendicular to a direction of extension of a length dimension of the aperture 14h of the conductive pad 14. A width dimension of the aperture 14h may be smaller than a width dimension of the second conductive layer 12m2.

In some embodiments, a patch antenna may be embedded within a substrate and electromagnetically coupled to a feed line embedded within the substrate. Due to a high dielectric constant (e.g., in a range from about 2 to about 4) of the substrate, a coupling efficiency between the patch antenna and the feed line may be decreased. In order to reduce the dielectric constant between the patch antenna and the feed line, a cavity may be formed between the patch antenna and the feed line and within the substrate. However, the formation of the cavity may increase a total thickness of the substrate and weaken a structure of the substrate, which may cause the substrate to collapse.

In accordance with some embodiments (e.g., as shown in FIG. 1A), the antenna 12 is formed on the dielectric layer 12d, which may be flip chip-bonded to the top surface 101 of the carrier 10, and the distance d is formed between the dielectric layer 12d and the top surface 101 of the carrier 10. A medium between the antenna 12 and the conductive pad 14 is air, which includes a low dielectric constant (e.g., about 1). Therefore, the antenna 12 and the conductive pad 14 may include improved coupling efficiency. In addition, since the distance d is formed between the dielectric layer 12d and the top surface 101 of the carrier 10, a cavity formed inside the carrier 10 may not be utilized. In comparison with some embodiments of the present disclosure (e.g., which include an antenna coupled to a substrate), the semiconductor device package 1 may be thicker, which may in turn reduce a total volume of the semiconductor device package 1 and manufacturing cost of the semiconductor device package 1.

Figure 2A:
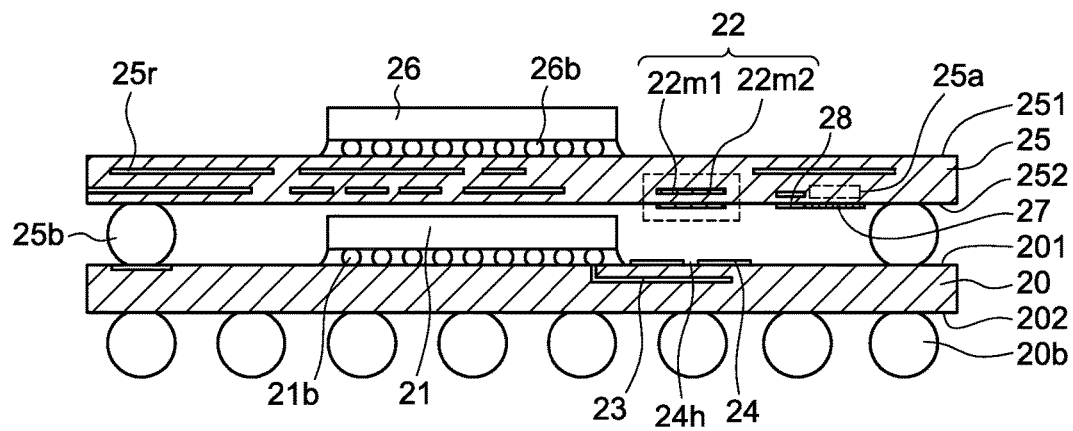
FIG. 2A illustrates a cross-sectional view of a semiconductor device package in accordance with some embodiments of the present disclosure.

FIG. 2A illustrates a cross-sectional view of a semiconductor device package 2 in accordance with some embodiments of the present disclosure. The semiconductor device package 2 includes a bottom carrier 20, a first electrical component 21, a first antenna 22, a first conductive line 23, a conductive pad 24, a top carrier 25, a second electrical component 26, a second antenna 27 and a second conductive line 28.

The top carrier 25 includes a top or first surface 251 and bottom or second surface 252 opposite to the top or first surface 251. The top carrier 25 may be, for example, a printed circuit board, such as a paper-based copper foil laminate, a composite copper foil laminate, or a polymer-impregnated glass-fiber-based copper foil laminate. The top carrier 25 may include an interconnection structure 25r, such as an RDL, for electrical connection between the second electrical component 26 and other electrical components mounted on the top carrier 25. In some embodiments, a dielectric constant of the top carrier 25 is in a range from about 2 to about 4.

The second electrical component 26 is disposed on the top surface 251 of the top carrier 25. The second electrical component 26 may include an active electrical component and/or a passive electrical component. The second electrical component 26 may be flip chip-bonded to the top surface 251 of the top carrier 25 via one or more electrical connections 26b. The electrical connections 26b may be, for example, conductive pads, solder balls or Cu pillars. In some embodiments, a diameter or a height of each electrical connection 26b is in a range from about 250 μm to about 400 μm. In some embodiments, the second electrical component 26 may be wire-bonded to the top surface 251 of the top carrier 25 via one or more bonding wires. The second electrical component 26 may be, for example, an IC chip (e.g., a complementary metal-oxide-semiconductor (CMOS) transceiver) or a die. In some embodiments, the second electrical component 26 may include passive elements, such as, for example, capacitors, resistors, inductors, or a combination thereof.

The bottom carrier 20 includes a top or first surface 201 and a bottom or second surface 202 opposite to the top or first surface 201. The bottom carrier 20 may be, for example, a printed circuit board, such as a paper-based copper foil laminate, a composite copper foil laminate, or a polymer-impregnated glass-fiber-based copper foil laminate. The bottom carrier 20 may include an interconnection structure, such as an RDL, for electrical connection between the first electrical component 21 and other electrical components mounted on the bottom carrier 20. In some embodiments, a dielectric constant of the bottom carrier 20 is in a range from about 2 to about 4. One or more electrical connections 20b are attached to the bottom surface 202 of the bottom carrier 20. The electrical connections 20b may be, for example, conductive pads, solder balls or Cu pillars.

In some embodiments, the first electrical component 21 is on the top surface 201 of the bottom carrier 20. The first electrical component 21 may include an active electrical component and/or a passive component. The first electrical component 21 may be flip chip-bonded to the top surface 201 of the bottom carrier 20 via one or more electrical connections 21b. The electrical connections 21b may be, for example, conductive pads, solder balls or Cu pillars. In some embodiments, a diameter or a height of each electrical connection 21b is in a range from about 250 μm to about 400 μm. In some embodiments, the first electrical component may be wire-bonded to the top surface 201 of the bottom carrier 20 via one or more bonding wires. The first electrical component 21 may be, for example, an IC chip (e.g., a CMOS transceiver) or a die. In some embodiments, the first electrical component 21 may include passive elements, for example, capacitors, resistors, inductors, or a combination thereof.

The top carrier 25 is bonded to the top surface 201 of the bottom carrier 20 via one or more electrical connections 25b. The electrical connections 25b may include, for example, solder balls or Cu pillars.

In some embodiments, the first antenna 22 is disposed on the bottom surface 252 of the top carrier 25. The first antenna 22 is spaced apart from the second electrical component 26. The first antenna 22 includes a first conductive layer 22m1 and a second conductive layer 22m2. The first conductive layer 22m1 is separated or spaced from the second conductive layer 22m2. In some embodiments, the first conductive layer 22m1 and the second conductive layer 22m2 include Ni, Pt, Au or a combination thereof. The first antenna 22 may include, for example, a patch antenna.

In some embodiments, the first antenna 22 is configured to transmit or to receive electromagnetic waves including a frequency in a range from about 56 GHz to about 64 GHz in a first direction. In some embodiments, the first direction is substantially perpendicular to the top surface 251 of the top carrier 25. In some embodiments, the first antenna 22 includes a bandwidth greater than about 7 GHz and a gain greater than about 10 dB.

In some embodiments, the conductive pad 24 is disposed on the top surface 201 of the bottom carrier 20 and opposite to the first antenna 22 (e.g., aligned with the first antenna 22). The conductive pad 24 includes an aperture 24h corresponding to (e.g., aligned with) the first antenna 22. The conductive pad 24 may include a resonant structure.

The first conductive line 23 is within the bottom carrier 20. In some embodiments, a part or first portion of the first conductive line 23 is formed on the top surface 201 of the bottom carrier 20. The first conductive line 23 may be electrically connected to the first electrical component 21 through one or more of the electrical connections 21b. A part or second portion of the first conductive line 23 extends beneath the conductive pad 24. The first conductive line 23 may be electromagnetically coupled to the first antenna 22 through the resonant structure of the conductive pad 24. In some embodiments, the first conductive line 23 is a feed line to electromagnetically couple or receive a signal received by the first antenna 22 and to transmit the coupled or received signal to the first electrical component 21. Alternatively, the first conductive line 23 may be a feed line to electromagnetically couple or receive a signal from the first electrical component 21 and transmit the received signal to the first antenna 22, and then the signal may be transmitted by the first antenna 22.

In some embodiments, the second antenna 27 is disposed on the bottom surface 252 of the top carrier 25 and spaced apart from the first antenna 22. The second antenna 27 may include, for example, a Yagi-Uda antenna. In some embodiments, a portion of the second antenna 27 is located at an area 25a within the top carrier 25 that is not grounded.

In some embodiments, the second antenna 27 is configured to transmit or receive electromagnetic waves with a frequency in a range from about 56 GHz to about 64 GHz in a second direction. In some embodiments, the second direction that electromagnetic waves are transmitted towards or received from by the second antenna 27 is different from the first direction that electromagnetic waves are transmitted towards or received from by the first antenna 22. In some embodiments, the second direction is substantially perpendicular to the first direction. In some embodiments, the second antenna 27 includes a bandwidth greater than about 7 GHz and a gain greater than about 10 dB.

In some embodiments, the second conductive line 28 is disposed on the bottom surface 252 of the top carrier 25 and spaced apart from the second antenna 27. The second conductive line 28 may be electrically connected to the second electrical component 26 through one or more of the electrical connections 26b. The second conductive line 28 may be electromagnetically coupled to the second antenna 27.

In some embodiments, a patch antenna may be embedded within a substrate and electromagnetically coupled to a feed line embedded within the substrate. Due to a high dielectric constant (e.g., in a range from about 2 to about 4) of the substrate, a coupling efficiency between the patch antenna and the feed line may be decreased. In order to reduce the dielectric constant between the patch antenna and the feed line, a cavity may be formed between the patch antenna and the feed line and within the substrate. However, the formation of the cavity may increase a total thickness of the substrate and weaken a structure of the substrate, which may cause the substrate to collapse.

Figure 2B:
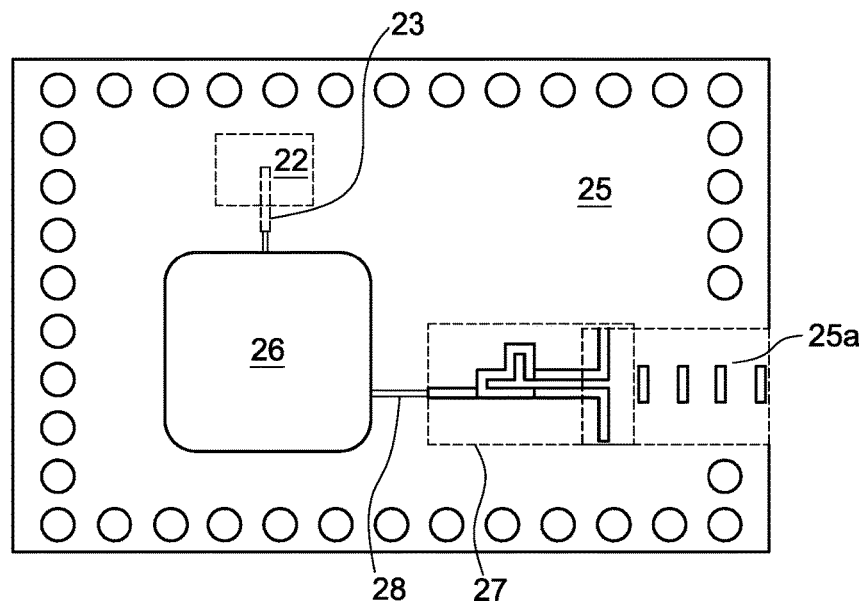
FIG. 2B illustrates a top view of a semiconductor device package in accordance with some embodiments of the present disclosure.

In accordance with some embodiments (e.g., as shown in FIG. 2B), a medium between the first antenna 22 and the conductive pad 24 is air, which includes a low dielectric constant (e.g., about 1). Therefore, the first antenna 22 and the conductive pad 24 may include improved coupling efficiency. In addition, a cavity formed inside the top carrier 25 or the bottom carrier 20 may not be utilized. Furthermore, the semiconductor device package 2 shown in FIG. 2B may include a package on package (PoP) structure, which may reduce a total area of the semiconductor device package 2 and manufacturing cost of the semiconductor device package 2.

FIG. 2B illustrates a top view of the top carrier 25 in accordance with some embodiments of the present disclosure. The top carrier 25 includes the second electrical component 26, the first antenna 22, the second antenna 27 and the second conductive line 28. The first conductive line 23 of the bottom carrier 20 is also illustrated.

In some embodiments, the first antenna 22 is located at a first side of the second electrical component 26 and spaced apart from the second electrical component 26. The first antenna 22 may be, for example, a patch antenna. The first antenna 22 is configured to transmit or receive electromagnetic waves including a frequency in a range from about 56 GHz to about 64 GHz in a first direction. In some embodiments, the first antenna 22 includes a bandwidth greater than about 7 GHz and a gain greater than about 10 dB.

In some embodiments, the second antenna 27 is at a second side of the second electrical component 26 and spaced apart from the second electrical component 26. In some embodiments, the first side of the second electrical component 26 is different from the second side of the second electrical component 26. Alternatively, the first side of the second electrical component 26 may be the same as the second side of the second electrical component 26. The second antenna 27 may be, for example, a Yagi-Uda antenna. A portion of the second antenna 27 is located at an area 25a within the top carrier 25 that is not grounded.

In some embodiments, the second antenna 27 is configured to transmit or receive electromagnetic waves including a frequency from about 56 GHz to about 64 GHz in a second direction. In some embodiments, the second direction that electromagnetic waves are transmitted towards or received from by the second antenna 27 is different from the first direction that electromagnetic waves are transmitted towards or received from by the first antenna 22. In some embodiments, the second direction is substantially perpendicular to the first direction. In some embodiments, the second antenna 27 includes a bandwidth greater than about 7 GHz and a gain greater than about 10 dB.

In some embodiments, the first conductive line 23 extends beneath the first antenna 22. In some embodiments, the first conductive line 23 is a feed line to electromagnetically couple to the first antenna 22. The second conductive line 28 is a feed line to electromagnetically couple to the second antenna 27. The electrical connections 25b surround the first antenna 22, the second electrical component 26 and the second antenna 27.

Figure 3A:
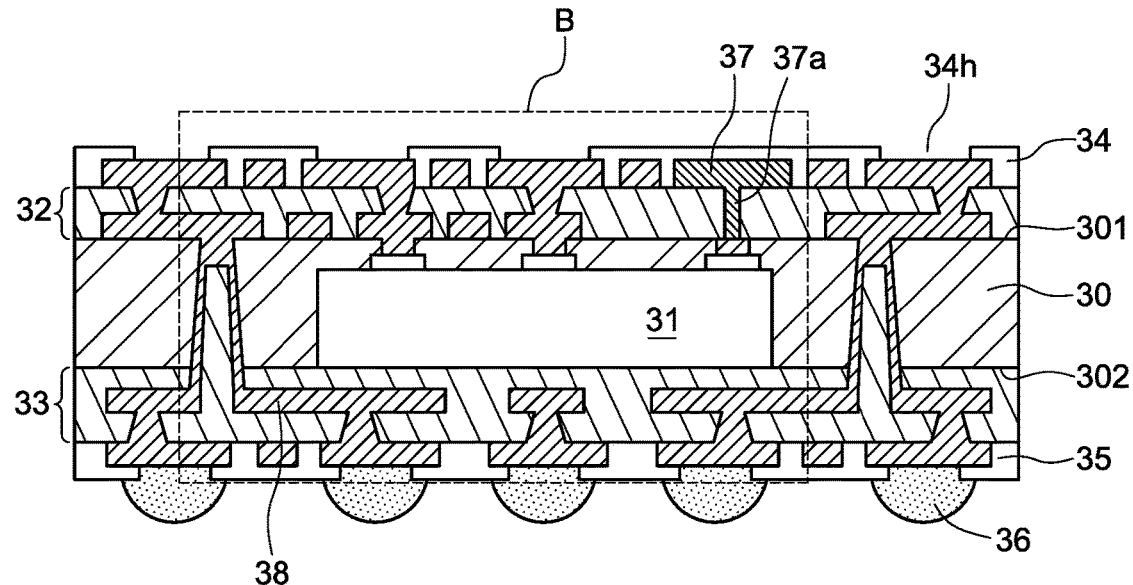
FIG. 3A illustrates a cross-sectional view of a semiconductor device package in accordance with some embodiments of the present disclosure.

FIG. 3A illustrates a cross-sectional view of a semiconductor device package 3 in accordance with some embodiments of the present disclosure. The semiconductor device package 3 includes a first dielectric layer 30, an electrical component 31, a second dielectric layer 32, a third dielectric layer 33, a first protective layer 34, a second protective layer 35 and an antenna 37.

The first dielectric layer 30 includes a top surface 301 and a bottom surface 302 opposite to the top surface 301. The first dielectric layer 30 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number of pre-impregnated materials and/or sheets.

In some embodiments, the electrical component 31 is embedded or located within the first dielectric layer 30. The electrical component 31 may include an active electrical component and/or a passive electrical component. The electrical component 31 may be, for example, an IC chip or a die. In some embodiments, the electrical component 31 may include passive elements, such as, for example, capacitors, resistors, inductors, or a combination thereof.

In some embodiments, the second dielectric layer 32 is on the top surface 301 of the first dielectric layer 30. The second dielectric layer 32 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number of pre-impregnated materials and/or sheets. In some embodiments, the second dielectric layer 32 is made from a different material from that of the first dielectric layer 30. Alternatively, the second dielectric layer 32 may be made from a same material as that of the first dielectric layer 30.

In some embodiments, the antenna 37 is on the second dielectric layer 32. The antenna 37 may be electrically connected to the electrical component 31 via an electrical connection 37a (e.g., a probe feed). The antenna 37 may be, for example, a patch antenna. In some embodiments, the antenna 37 is configured to transmit or to receive electromagnetic waves including a frequency in a range from about 56 GHz to about 64 GHz. In some embodiments, the antenna 37 includes a bandwidth greater than about 7 GHz and a gain greater than about 10 dB.

In some embodiments, the first protective layer 34 is disposed on the second dielectric layer 32 and covers the antenna 37 and one or more portions of the second dielectric layer 32. In some embodiments, the first protective layer 34 includes a solder resist layer or a solder mask.

In some embodiments, the third dielectric layer 33 is attached or coupled to the bottom surface 302 of the first dielectric layer 30. The third dielectric layer 33 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number of pre-impregnated materials and/or sheets. In some embodiments, the third dielectric layer 33 is made from a different material from that of the first dielectric layer 30. Alternatively, the third dielectric layer 33 may be made from a same material as that of the first dielectric layer 30.

In some embodiments, the second protective layer 35 is attached or coupled to the third dielectric layer 33. In some embodiments, the second protective layer 35 is a solder resist layer or a solder mask.

In some embodiments, one or more electrical connections 38 penetrate the first dielectric layer 30, the second dielectric layer 32 and the third dielectric layer 33 and electrically connect the electrical component 31 to other electrical components within the first dielectric layer 30 or to external circuits. A portion or portions of the electrical connections 38 are exposed from the first protective layer 34 or the second protective layer 35. The portion or portions of the electrical connections 38 exposed from the second protective layer 35 are electrically connected to one or more solder balls 36.

Figure 3B:
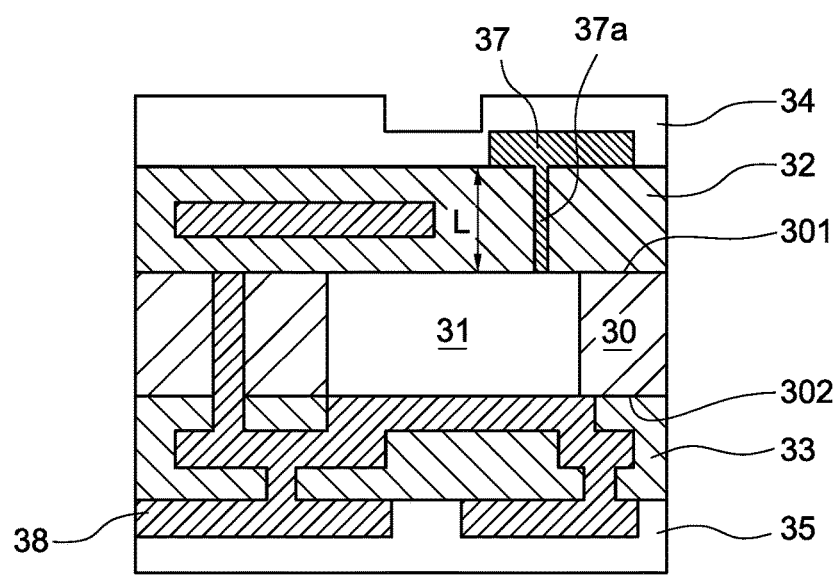
FIG. 3B illustrates an enlarged view of a portion of the semiconductor device package shown in FIG. 3A in accordance with some embodiments of the present disclosure.

FIG. 3B illustrates an enlarged portion of the semiconductor device package 3 according to some embodiments of the present disclosure, the enlargement taken from the dotted square area marked as "B" in FIG. 3A. In some embodiments, the length L of the electrical connection 37a measured from the top surface 301 of the first dielectric layer 30 to the antenna 37 is in a range from about 112 μm to about 144 μm.

In comparison with a semiconductor device package including a long electrical connection (e.g., about 500 μm) between a patch antenna and a die, the semiconductor device package 3 includes the shorter electrical connection 37a, which may in turn reduce a transmission loss between the antenna 37 and the electrical component 31 and a total volume of the semiconductor device package 3. The antenna 37 may be electrically connected to the electrical component 31 through the electrical connection 37a.

Figure 4A:
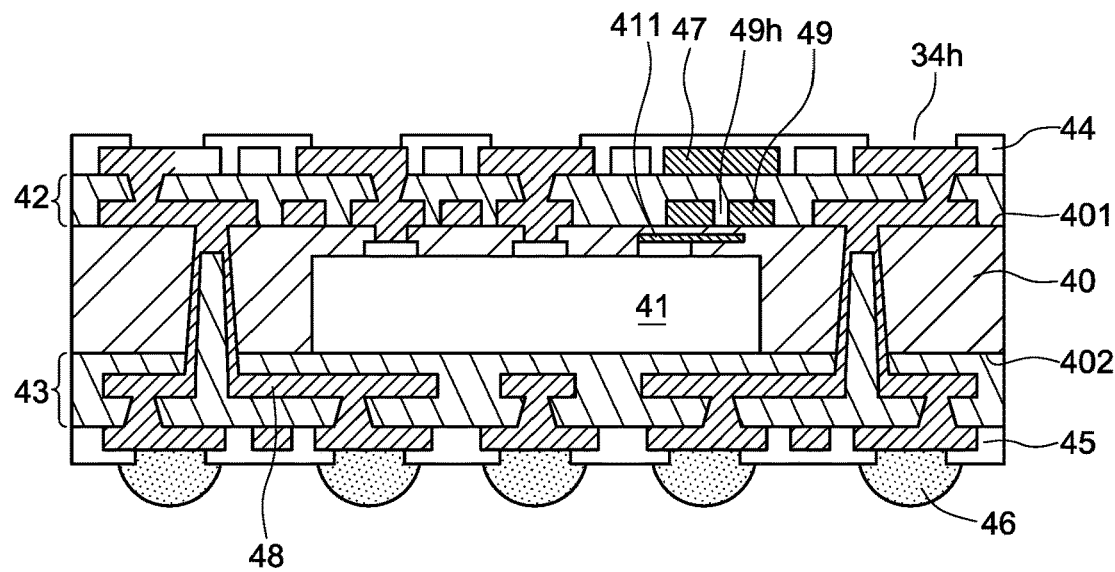
FIG. 4A illustrates a cross-sectional view of a semiconductor device package in accordance with some embodiments of the present disclosure.

FIG. 4A illustrates a cross-sectional view of a semiconductor device package 4 in accordance with some embodiments of the present disclosure. The semiconductor device package 4 includes a first dielectric layer 40, an electrical component 41, a second dielectric layer 42, a third dielectric layer 43, a first protective layer 44, a second protective layer 45 and an antenna 47.

The first dielectric layer 40 includes a top surface 401 and a bottom surface 402 opposite to the top surface 401. The first dielectric layer 40 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number of pre-impregnated materials and/or sheets.

In some embodiments, the electrical component 41 is embedded or located within the first dielectric layer 40. The electrical component 41 may include an active electrical component and/or a passive electrical component. The electrical component 41 may be, for example, an IC chip or a die. In some embodiments, the electrical component 31 may include passive elements, such as, for example, capacitors, resistors, inductors, or a combination thereof.

In some embodiments, the second dielectric layer 42 is disposed on the top surface 401 of the first dielectric layer 40. The second dielectric layer 42 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number of pre-impregnated materials and/or sheets. In some embodiments, the second dielectric layer 42 is made from a different material from that of the first dielectric layer 40. Alternatively, the second dielectric layer 42 may be made from a same material as that of the first dielectric layer 40.

In some embodiments, the antenna 47 is disposed on the second dielectric layer 42. The antenna 47 may be, for example, a patch antenna. In some embodiments, the antenna 47 is configured to transmit or to receive electromagnetic waves including a frequency in a range from about 56 GHz to about 64 GHz. In some embodiments, the antenna 47 includes a bandwidth greater than about 7 GHz and a gain greater than about 10 dB.

In some embodiments, a conductive pad 49 is embedded within the second dielectric layer 42 and encapsulated by the second dielectric layer 42. The conductive pad 49 is beneath the antenna 47. The conductive pad 49 includes an aperture 49h. The conductive pad 49 may include a resonant structure.

In some embodiments, a conductive line 411 is disposed on the first dielectric layer 40 and encapsulated by the second dielectric layer 42. The conductive line 411 is electrically connected to the electrical component 41 through one or more electrical connections. A part or portion of the conductive line 411 extends beneath the conductive pad 49 and the antenna 47. The conductive line 411 may be electromagnetically coupled to the antenna 47 through the resonant structure of the conductive pad 49. In some embodiments, the conductive line 411 is a feed line to electromagnetically couple or receive a signal received by the antenna 47 and to transmit the coupled or received signal to the electrical component 41. Alternatively, the conductive line 411 may be a feed line to electromagnetically couple or receive a signal from the electrical component 41 and transmit the received signal to the antenna 47, and then the signal may be transmitted by the antenna 47.

In some embodiments, the first protective layer 44 is disposed on the second dielectric layer 42 and covers the antenna 47 and a portion or portions of the second dielectric layer 42. In some embodiments, the first protective layer 44 is a solder resist layer or a solder mask.

In some embodiments, a plurality of electrical connections 48 penetrate or are disposed in the first dielectric layer 40 and the second dielectric layer 42 and electrically connect the electrical component 41 to other electrical components within the first dielectric layer 40 or to external circuits. A portion or portions of the electrical connections 48 are exposed from the first protective layer 44 or the second protective layer 45. The portion or portions of the electrical connections 48 exposed from the second protective layer 45 are electrically connected to one or more solder balls 46.

Figure 4B:
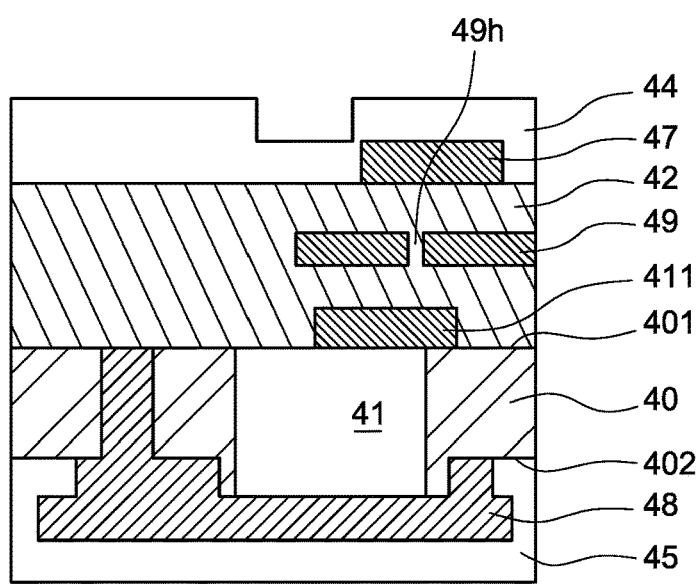
FIG. 4B illustrates a cross-sectional view of a semiconductor device package in accordance with some embodiments of the present disclosure.

FIG. 4B illustrates a cross-sectional view of a semiconductor device package 4 in accordance with some embodiments of the present disclosure. The semiconductor device package 4 includes the first dielectric layer 40, the electrical component 41, the second dielectric layer 42, the first protective layer 44, the second protective layer 45, the antenna 47, the conductive pad 49 and the conductive line 411.

The first dielectric layer 40 includes the top surface 401 and the bottom surface 402 opposite to the top surface 401. The first dielectric layer 40 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number of pre-impregnated materials and/or sheets.

In some embodiments, the second protective layer 45 is attached or coupled to the bottom surface 402 of the first dielectric layer 40. In some embodiments, the second protective layer 45 is a solder resist layer or a solder mask.

The electrical component 41 is embedded or located within the first dielectric layer 40 and the second protective layer 45. The electrical component 41 may include an active electrical component and/or a passive electrical component. The electrical component 41 may be, for example, an IC chip or a die. In some embodiments, the electrical component 41 may include passive elements, such as, for example, capacitors, resistors, inductors, or a combination thereof.

In some embodiments, the second dielectric layer 42 is disposed on the top surface 401 of the first dielectric layer 40. The second dielectric layer 42 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number of pre-impregnated materials and/or sheets. In some embodiments, the second dielectric layer 42 is made from a different material from that of the first dielectric layer 40. Alternatively, the second dielectric layer 42 may be made from a same material as that of the first dielectric layer 40.

In some embodiments, the antenna 47 is disposed on the second dielectric layer 42. The antenna 47 may be, for example, a patch antenna. In some embodiments, the antenna 47 is configured to transmit or to receive electromagnetic waves including a frequency in a range from about 56 GHz to about 64 GHz. In some embodiments, the antenna 47 includes a bandwidth greater than about 7 GHz and a gain greater than about 10 dB.

In some embodiments, the conductive pad 49 is embedded within the second dielectric layer 42 and encapsulated by the second dielectric layer 42. The conductive pad 49 is beneath the antenna 47. The conductive pad 49 includes an aperture 49h. The conductive pad 49 may include a resonant structure.

In some embodiments, the conductive line 411 is disposed on the first dielectric layer 40 and encapsulated by the second dielectric layer 42. The conductive line 411 is electrically connected to the electrical component 41 through one or more electrical connections. A part or portion of the conductive line 411 extends beneath the conductive pad 49 and the antenna 47. The conductive line 411 may be electromagnetically coupled to the antenna 47 through the resonant structure of the conductive pad 49. In some embodiments, the conductive line 411 is a feed line to electromagnetically couple or receive a signal received by the antenna 47 and to transmit the coupled or received signal to the electrical component 41. Alternatively, the conductive line 411 may be a feed line to electromagnetically couple or receive a signal from the electrical component 41 and transmit the received signal to the antenna 47, and then the signal may be transmitted by the antenna 47.

In some embodiments, the first protective layer 44 is disposed on the second dielectric layer 42 and covers the antenna 47 and a portion or portions of the second dielectric layer 42. In some embodiments, the first protective layer 44 is a solder resist layer or a solder mask.

In some embodiments, a plurality of electrical connections 48 penetrate or are disposed in the first dielectric layer 40 and electrically connect the electrical component 41 to other electrical components within the first dielectric layer 40 or to external circuits.

Figure 5:
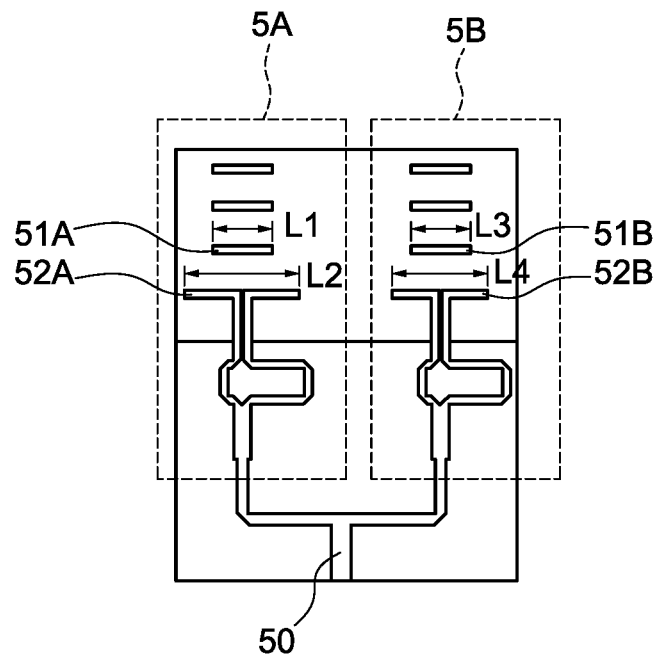
FIG. 5 illustrates a cross-sectional view of an antenna in accordance with some embodiments of the present disclosure.

FIG. 5 illustrates an antenna 5 in accordance with some embodiments of the present disclosure. The antenna 5 may be a Yagi-Uda antenna. The antenna 5 includes a first driven portion 5A, a second driven portion 5B and a feedline 50.

The first driven portion 5A includes a director 51A and a driver 52A. The director 51A is physically separated or spaced from the driver 52A, and is electromagnetically coupled with the driver 52A. In some embodiments, a length L1 of the director 51A is less than a length L2 of the driver 52A.

The second driven portion 5B includes a director 51B and a driver 52B. The director 51B is physically separated or spaced from the driver 52B, and is electromagnetically coupled with the driver 52B. In some embodiments, a length L3 of the director 51B is less than a length L4 of the driver 52B. The length L2 of the driver 52A of the first driven portion 5A is different from the length L4 of the driver 52B of the second driven portion 5B. In some embodiments, a ratio of L3 to L4 is in a range from about 1.1 to about 1.3.

In comparative Yagi-Uda antennas, a length of a driver of a first driven portion is identical to that of a second driven portion. In order to increase a gain or bandwidth of an antenna, a plurality of antenna arrays may be used, which may increase a total area of a chip and manufacturing cost. In comparison with the comparative Yagi-Uda antennas, the antenna 5 in FIG. 5 includes a higher gain and bandwidth by utilizing different lengths (e.g., L2, L4) of the drivers 52A, 52B of antenna 5 without increasing a number of antennas. In some embodiments, the antenna 5 can be applied to any of the semiconductor device packages 1, 2, 3, 4 shown in FIGS. 1A, 2A, 3A and 4A, and the antenna 5 may effectively reduce a total area of the semiconductor device packages and manufacturing cost.

Figure 6:
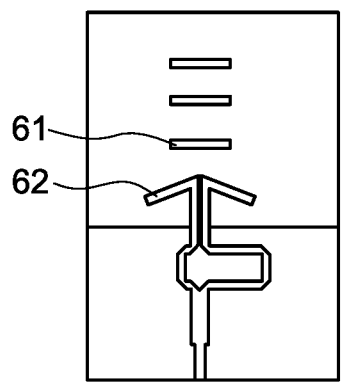
FIG. 6 illustrates a cross-sectional view of an antenna in accordance with some embodiments of the present disclosure.

FIG. 6 illustrates an antenna 6 in accordance with some embodiments of the present disclosure. The antenna 6 includes a configuration that is similar to that of the first driven portion 5A of the antenna 5 shown in FIG. 5. However, in some embodiments, a driver 62 of the antenna 6 is not parallel to a director 61 of the antenna 6. In some embodiments, the driver 62 and the director 61 include an angle in a range from about 10° to about 25°.

In comparison with comparative Yagi-Uda antennas in which a director is parallel to a driver, the antenna 6 shown in FIG. 6 may include higher gain and bandwidth. In some embodiments, the antenna 6 can be applied to any of the semiconductor device packages 1, 2, 3, 4 shown in FIGS. 1A, 2A, 3A, 4A, and 4B, and may effectively reduce a total area of a semiconductor device package and manufacturing cost.

Figure 7:
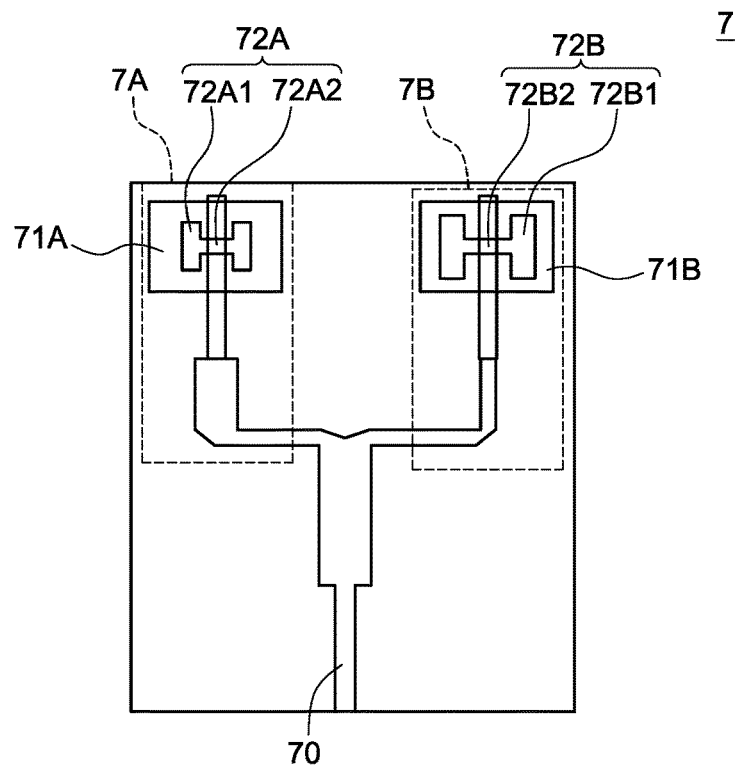
FIG. 7 illustrates a cross-sectional view of an antenna in accordance with some embodiments of the present disclosure.

FIG. 7 illustrates an antenna 7 in accordance with some embodiments of the present disclosure. In some embodiments, the antenna 7 is a patch antenna. The antenna 7 includes a feedline 70, a first portion 7A and a second portion 7B.

In some embodiments, the first portion 7A includes a patch region 71A and an aperture 72A. The aperture 72A includes a first part 72A1 and a second part 72A2 substantially perpendicular to the first part 72A1. In some embodiments, the aperture 72A includes an H-shape.

In some embodiments, the first portion 7A includes a patch region 71B and an aperture 72B. The aperture 72B includes a first part 72B1 and a second part 72B2 substantially perpendicular to the first part 72B1. In some embodiments, the aperture 72B includes an H-shape. An area of the patch region 71B may be substantially identical to that of the patch region 71A. In other embodiments, an area of the aperture 72B is different from that of the aperture 72A. For example, a length of the first part 72B1 of the aperture 72B may be longer than that of the first part 72A1 of the aperture 72A and a length of the second part 72B2 of the aperture 72B may be longer than that of the second part 72A2 of the aperture 72A. In some embodiments, an area of the aperture 72B is about 1.5 times larger than that of the aperture 72A.

In comparative patch antennas, sizes of two patch regions may be different. In comparison with comparative patch antennas, the antenna 7 shown in FIG. 7 may include higher gain and bandwidth by using two patch regions including a same size and using two apertures including different sizes. In some embodiments, a bandwidth of the antenna 7 is about 1.3 times larger than that of comparative patch antennas. In some embodiments, the antenna 7 can be applied to any of the semiconductor device packages 1, 2, 3, 4 shown in FIGS. 1A, 2A, 3A, 4A, and 4B.

Figure 8:
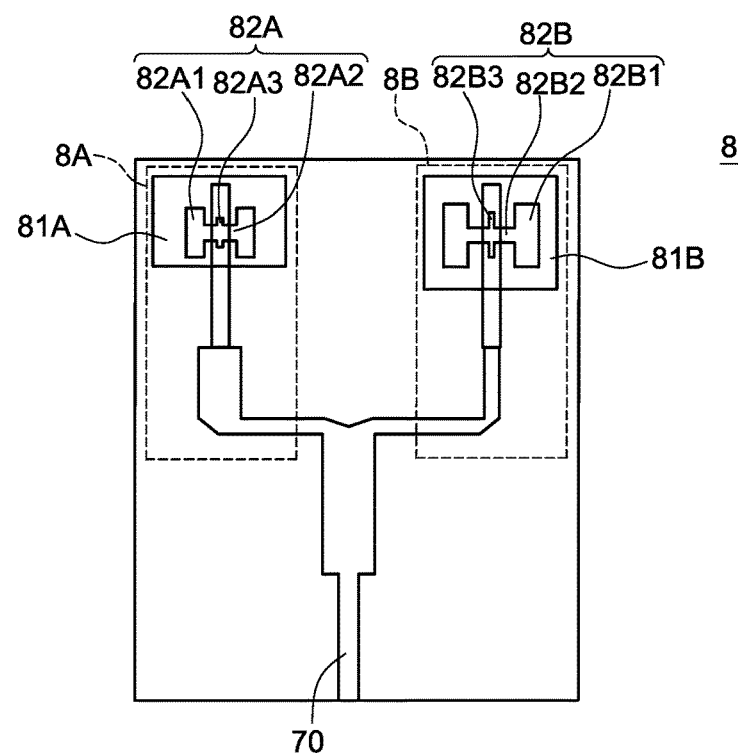
FIG. 8 illustrates a cross-sectional view of an antenna in accordance with some embodiments of the present disclosure.

FIG. 8 illustrates an antenna 8 in accordance with some embodiments of the present disclosure. The antenna 8 may be similar to the antenna 7 shown in FIG. 7 except that apertures 82A and 82B further include respective third parts 82A3, 82B3.

In some embodiments, the third part 82A3 of the aperture 82A is located between the first parts 82A1 of the aperture 82A. The third part 82A3 of the aperture 82A is substantially perpendicular to the second part 82A2 of the aperture 82A.

In some embodiments, the third part 82B3 of the aperture 82B is located between the first parts 82B1 of the aperture 82B. The third part 82B3 of the aperture 82B is substantially perpendicular to the second part 82B2 of the aperture 82B.

By adding the third part 82A3, 82B3 to the respective apertures 82A, 82B, a bandwidth and a gain of the antenna 8 may increase in comparison with comparative patch antennas. In some embodiments, the bandwidth of the antenna 8 is about 1.3 times larger than that of comparative patch antennas. In some embodiments, the antenna 8 can be applied to any of the semiconductor device packages 1, 2, 3, 4 shown in FIGS. 1A, 2A, 3A, 4A, and 4B.

As used herein, the terms "substantially," "substantial," "approximately," and "about" are used to denote small variations. For example, when used in conjunction with a numerical value, the terms can refer to variations less than or equal to ±10% relative to that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along the same plane, such as within 100 μm, within 80 μm, within 60 μm, within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the singular terms "a," "an," and "the" may include plural referents unless the context clearly dictates otherwise.

In the description of some embodiments, a component provided "on" or "over" another component can encompass cases where the former component is directly on (e.g., in physical contact with) the latter component, as well as cases where one or more intervening components are located between the former component and the latter component. In the description of some embodiments, a component provided "beneath" or "under" another component can encompass cases where the former component is directly under (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a carrier comprising a top surface;
an electrical component disposed over the top surface of the carrier;
an antenna disposed over the top surface of the carrier and spaced from the electrical component;
a conductive pad disposed over the top surface of the carrier and beneath the antenna, wherein the conductive pad comprises a resonant structure; and
a conductive line electrically connected to the electrical component and extending within the carrier,
wherein a part of the conductive line is located beneath the antenna and the resonant structure of the conductive pad.

2. The semiconductor device package according to claim 1, wherein the antenna comprises a first conductive layer, a second conductive layer, a dielectric layer disposed between the first conductive layer and the second conductive layer and a plurality of electrical connections disposed on the dielectric layer and electrically connected to the top surface of the carrier.

3. The semiconductor device package according to claim 2, wherein a thickness of the dielectric layer is about 80 micrometers (μm).

4. The semiconductor device package according to claim 2, wherein the first conductive layer and the second conductive layer comprise Nickel (Ni), Platinum (Pt), Gold (Au) or a combination thereof.

5. The semiconductor device package according to claim 2, wherein each electrical connection includes a diameter in a range from about 250 µm to about 400 µm.

6. The semiconductor device package according to claim 1, wherein the resonant structure defines an aperture in the conductive pad.

7. The semiconductor device package according to claim 6, wherein the conductive line extends such that a part of the conductive line is beneath the aperture of the conductive pad.

8. The semiconductor device package according to claim 1, wherein the antenna and the conductive pad are separated by a distance defined by the electrical connections.

9. The semiconductor device package according to claim 1, wherein the top surface of the carrier and the conductive line are separated by a distance.

10. The semiconductor device package according to claim 1, wherein the carrier comprises a dielectric constant in a range from about 2 to about 4.

11. The semiconductor device package according to claim 1, wherein the antenna is a path antenna.

12. A semiconductor device package, comprising:
   a carrier comprising a top surface and a conductive line;
   an electrical component disposed over the top surface of the carrier;
   an antenna disposed over the top surface of the carrier and spaced from the electrical component;
   a conductive pad disposed over the top surface of the carrier and beneath the antenna, wherein the conductive pad comprises a resonant structure; and
   a conductive line electrically connected to the electrical component and electromagnetically coupled to the antenna through the resonant structure of the conductive pad.

13. The semiconductor device package according to claim 12, wherein the antenna comprises a first conductive layer, a second conductive layer, a dielectric layer disposed between the first conductive layer and the second conductive layer and a plurality of electrical connections disposed on the dielectric layer and electrically connected to the top surface of the carrier.

14. The semiconductor device package according to claim 13, wherein the antenna and the conductive pad are spaced by a distance defined by the electrical connections.

15. The semiconductor device package according to claim 12, wherein the antenna is configured to transmit or to receive electromagnetic waves comprising a frequency in a range from about 56 Gigahertz (GHz) to about 64 GHz.

16. The semiconductor device package according to claim 12, wherein a bandwidth of the antenna is greater than about 7 GHz.

17. The semiconductor device package according to claim 12, wherein a gain of the antenna is greater than about 10 decibels (dB).

18. The semiconductor device package according to claim 12, wherein the resonant structure defines an aperture in the conductive pad and a part of the conductive line is located beneath the antenna and the aperture of the conductive pad.

19. The semiconductor device package according to claim 12, wherein a dielectric constant of a medium between the antenna and the conductive pad is about 1.

20. The semiconductor device package according to claim 12, wherein the resonant structure extends in a direction substantially perpendicular to a direction that the conductive line extends.

* * * * *